United States Patent
Ahlers et al.

(10) Patent No.: US 9,881,853 B2
(45) Date of Patent: Jan. 30, 2018

(54) SEMICONDUCTOR PACKAGE HAVING A SOURCE-DOWN CONFIGURED TRANSISTOR DIE AND A DRAIN-DOWN CONFIGURED TRANSISTOR DIE

(71) Applicant: Infineon Technologies AG, Neubiberg (DE)

(72) Inventors: Dirk Ahlers, Munich (DE); Markus Dinkel, Unterhaching (DE)

(73) Assignee: Infineon Technologies AG, Neubiberg (DE)

(*) Notice: Subject to any disclaimer, the term of this patent is extended or adjusted under 35 U.S.C. 154(b) by 0 days.

(21) Appl. No.: 15/089,668

(22) Filed: Apr. 4, 2016

(65) Prior Publication Data

US 2017/0287820 A1     Oct. 5, 2017

(51) Int. Cl.
| | |
|---|---|
| H01L 23/495 | (2006.01) |
| H01L 23/31 | (2006.01) |
| H01L 21/48 | (2006.01) |
| H01L 21/56 | (2006.01) |
| H02M 7/00 | (2006.01) |
| H02M 7/44 | (2006.01) |

(52) U.S. Cl.
CPC .... *H01L 23/49575* (2013.01); *H01L 21/4825* (2013.01); *H01L 21/565* (2013.01); *H01L 23/3114* (2013.01); *H01L 23/4952* (2013.01); *H01L 23/49503* (2013.01); *H01L 23/49524* (2013.01); *H01L 23/49562* (2013.01); *H02M 7/003* (2013.01); *H02M 7/44* (2013.01)

(58) Field of Classification Search
CPC ............ H01L 23/3114; H01L 23/4952; H01L 23/49524; H01L 23/49562; H01L 23/49575; H02M 7/003; H02M 7/44
See application file for complete search history.

(56) References Cited

U.S. PATENT DOCUMENTS

| | | | |
|---|---|---|---|
| 6,700,793 B2 * | 3/2004 | Takagawa | H01L 23/49562 257/E23.044 |
| 7,880,230 B2 | 2/2011 | Otremba | |
| 2011/0049690 A1 * | 3/2011 | Cho | H01L 21/4832 257/676 |
| 2012/0161128 A1 * | 6/2012 | Macheiner | H01L 23/49537 257/48 |
| 2012/0292752 A1 * | 11/2012 | Cho | H01L 23/3735 257/675 |

(Continued)

*Primary Examiner* — Peniel M Gumedzoe
(74) *Attorney, Agent, or Firm* — Murphy, Bilak & Homiller, PLLC (57) ABSTRACT

A semiconductor package includes a substrate, a first transistor die secured to the substrate and a second transistor die secured to the substrate. The first transistor die has a source terminal at a bottom side of the first transistor die which faces the substrate and a drain terminal and a gate terminal at a top side of the first transistor die which faces away from the substrate. The second transistor die has a drain terminal at a bottom side of the second transistor die which faces the substrate and a source terminal and a gate terminal at a top side of the second transistor die which faces away from the substrate. The package also includes a common electrical connection between the drain terminal of the first transistor die and the source terminal of the second transistor die.

16 Claims, 9 Drawing Sheets

(56) References Cited

U.S. PATENT DOCUMENTS

2014/0264611 A1* 9/2014 Lee .................... H01L 24/80
                                                    257/368
2016/0172280 A1* 6/2016 Ranmuthu ........ H01L 23/49568
                                                    257/379

* cited by examiner

SEMICONDUCTOR PACKAGE HAVING A SOURCE-DOWN CONFIGURED TRANSISTOR DIE AND A DRAIN-DOWN CONFIGURED TRANSISTOR DIE

TECHNICAL FIELD

The instant application relates to semiconductor packages, and more particularly to semiconductor packages which include one or more legs of a converter or controller circuit.

BACKGROUND

An H bridge is an electronic circuit that enables a voltage to be applied across a load in either direction. H bridge circuits are widely used in robotics and other applications to allow DC motors to run forwards and backwards. Most DC-to-AC converters (power converters), most AC/AC converters, the DC-to-DC push-pull converter, most motor controllers, and many other kinds of power electronics use H bridges. For example, a bipolar stepper motor is almost invariably driven by a motor controller containing two H bridges. An H bridge includes two pairs of switches with the load connected between the common switch/phase node of each switch pair. A common variation of the H bridge uses just one pair of switches on one side of the load, and is referred to as a half bridge. Half bridges are typically used in switched-mode power supplies that use synchronous rectifiers and in switching amplifiers. Another common variation adds a third 'leg' or even a fourth leg to the bridge configuration so as to realize a three-phase or four-phase converter.

Each leg of an H bridge, half bridge or multi-phase converter circuit includes a high-side switch and a low-side switch electrically connected at a common switch/phase node. The high-side and low-side switches are typically implemented as transistor dies such as power MOSFET (metal-oxide-semiconductor field-effect transistor) dies, which are often integrated in the same package such as a leadless or leaded molded package. Standard MOSFET dies have the source and gate terminals on the front side of the die and the drain terminal on the back side, which increases the resistance and inductance of the connection to the common switch/phase node of each transistor die pair.

SUMMARY

According to an embodiment of a semiconductor package, the semiconductor package comprises a substrate, a first transistor die secured to the substrate and a second transistor die secured to the substrate. The first transistor die has a source terminal at a bottom side of the first transistor die which faces the substrate and a drain terminal and a gate terminal at a top side of the first transistor die which faces away from the substrate. The second transistor die has a drain terminal at a bottom side of the second transistor die which faces the substrate and a source terminal and a gate terminal at a top side of the second transistor die which faces away from the substrate. The package also includes a common electrical connection between the drain terminal of the first transistor die and the source terminal of the second transistor die.

According to an embodiment of a method of manufacturing a semiconductor package, the method comprises: securing a first transistor die secured to a substrate, the first transistor die having a source terminal at a bottom side of the first transistor die which faces the substrate and a drain terminal and a gate terminal at a top side of the first transistor die which faces away from the substrate; securing a second transistor die to the substrate, the second transistor die having a drain terminal at a bottom side of the second transistor die which faces the substrate and a source terminal and a gate terminal at a top side of the second transistor die which faces away from the substrate; and forming a common electrical connection between the drain terminal of the first transistor die and the source terminal of the second transistor die.

According to another embodiment of a semiconductor package, the semiconductor package comprises a substrate and at least two pairs of transistor dies secured to the substrate. Each pair of transistor dies provides one phase of a multi-phase converter circuit and includes a source-down configured transistor die having a source terminal facing the substrate and a drain terminal and a gate terminal facing away from the substrate, and a drain-down configured transistor die having a drain terminal facing the substrate and a source terminal and a gate terminal facing away from the substrate. For each pair of transistor dies, the drain terminal of the source-down configured transistor die is electrically connected to the source terminal of the drain-down configured transistor die.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a semiconductor package which includes one or more pairs of transistor dies. Each transistor die pair included in the package has a source-down configured transistor die with its source terminal facing the package substrate and its drain and gate terminals facing away from the package substrate, and a drain-down configured transistor die with its drain terminal facing the package substrate and its source and gate terminals facing away from the package substrate. For each transistor die pair included in the package, the drain terminal of the source-down configured transistor die is electrically connected to the source terminal of the drain-down configured transistor die at a common switch/phase node. By using different transistor die technologies to implement each transistor die pair included in the package, with one of the dies having a source-down configuration and the other die having a drain-down configuration, the resistance and inductance of the electrical connection to the common switch/phase node of each transistor die pair is reduced while also reducing the stray inductance of the package.

In some embodiments, a single transistor pair is included in the package to form a half bridge circuit or one leg of an H bridge or multi-phase converter circuit. In other embodiments, two transistor pairs are included in the package to form an H bridge. In still other embodiments, three or more transistor pairs are included in the package to form a multi-phase (e.g. 3-phase or 4-phase) converter circuit.

Figure 1:
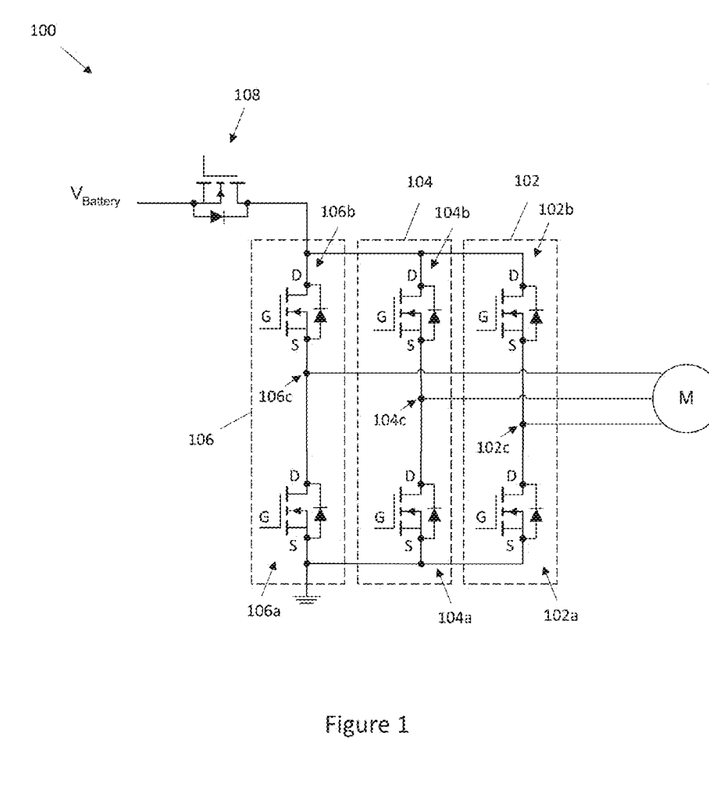
FIG. 1 illustrates a circuit schematic of an exemplary 3-phase converter circuit which includes three pairs of transistor dies, each transistor die pair configured as one leg of the 3-phase converter.

FIG. 1 illustrates a circuit schematic of an exemplary 3-phase converter circuit 100 which includes three pairs 102, 104, 106 of transistor dies. Each pair 102, 104, 106 of transistor dies is configured as one leg of the 3-phase converter 100. Each transistor die pair 102, 104, 106 includes a source-down configured transistor die 102a, 104a, 104b having its source terminal (S) electrically connected to ground potential, and a drain-down configured transistor die 102b, 104b, 106b with its drain terminal (D) electrically connected to a power terminal ($V_{Battery}$) e.g. via a protection device 108. The drain terminal of the source-down configured transistor die 102a/104a/106a and the source terminal of the drain-down configured transistor die 102b/104b/106b of each transistor die pair 102, 104, 106 are electrically connected to one another at a common switch/phase node 102c, 104c, 106c to form one phase of the multi-phase converter circuit 100. The load connected to the multi-phase converter circuit 100 is illustrated as a 3-phase motor (M) in FIG. 1. The transistor die pairs 102, 104, 106 can be included in the same package, or in different packages.

Figure 2:
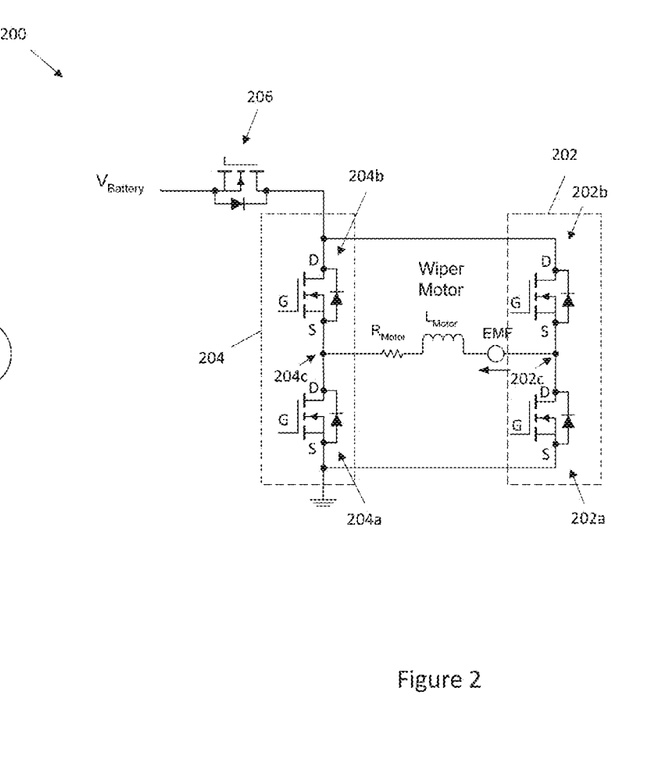
FIG. 2 illustrates a circuit schematic of an exemplary H bridge circuit which includes two pairs of transistor dies with an inductive load such as a motor connected between the common switch/phase node of the two transistor die pairs.

FIG. 2 illustrates a circuit schematic of an exemplary H bridge circuit 200 which includes two pairs 202, 204 of transistor dies with an inductive load such as a motor connected between the common switch/phase node 202c, 204c of the two transistor pairs. The inductive load is represented by an inductor labeled $L_{Motor}$ and a resistor labeled $R_{Motor}$. Similar to the configuration shown in FIG. 1, both transistor die pairs 202, 204 include a source-down configured transistor die 202a/204a having its source terminal (S) electrically connected to ground potential and a drain-down configured transistor die 202b/204b with its drain terminal (D) electrically connected to a power terminal ($V_{Battery}$) e.g. via a protection device 206. Both transistor die pairs 202, 204 can be included in the same package, or in different packages. A half bridge circuit instead can be realized by using just one pair of switches on one side of the load.

In each case, a source-down configured transistor die is used as the low-side switch and a drain-down configured transistor die is used as the high-side switch of each leg of the converter/controller circuit. In one embodiment, the source-down configured transistor die is a multi-gate MOSFET die and the drain-down configured transistor die is a single-gate MOSFET die. A multi-gate device or multiple gate field-effect transistor refers to a MOSFET which incorporates more than one gate into a single device. The multiple gates can be controlled by a single gate electrode, where multiple gate surfaces act electrically as a single gate, or instead controlled by independent gate electrodes. In one embodiment, the multi-gate MOSFET die which functions as the low-side switch is a power FinFET die. The term 'FinFET' describe a nonplanar, multi-gate transistor. A distinguishing characteristic of a FinFET is that the conducting channel is wrapped by a thin semiconductor 'fin', which forms the body of the device. A single-gate MOSFET does not have such a fin and only a single gate surface acts electrically as the device gate. There are sure further possibilities to realize the source-down configured transistor die. For example, the source-down configured transistor die can be realized with a lateral device as known from bipolar CMOS DMOS (BCD) processes. Such a transistor uses a standard gate configuration. The difference to the FinFET is that the FinFET structure is rotated by 90°, stretching into the depth of the silicon rather than being parallel to the surface.

Various semiconductor package embodiments are described next in which one or more pairs of transistor dies are included in the package, each transistor die pair including a source-down configured transistor die and a drain-down configured transistor die which are electrically connected to one another at a common switch/phase node. The transistor dies of each pair can be fabricated from any semiconductor technology such as Si, GaAs, GanN, SiC, etc. so long as one of the dies of each pair has a source-down configuration and the other die has a drain-down configuration. The other transistor terminals are at the opposite side of the die i.e. the drain and gate (G) terminals in the case of the source-down configured transistor die and the source and gate terminals in the case of the drain-down configured transistor die. Each package shows one transistor die pair for ease of illustration, but can include more than one transistor die pair e.g. in the case of an H bridge or multi-phase converter circuit. Alternatively, each leg of an H bridge or multi-phase converter circuit can be provided in a separate package.

Figure 3A:
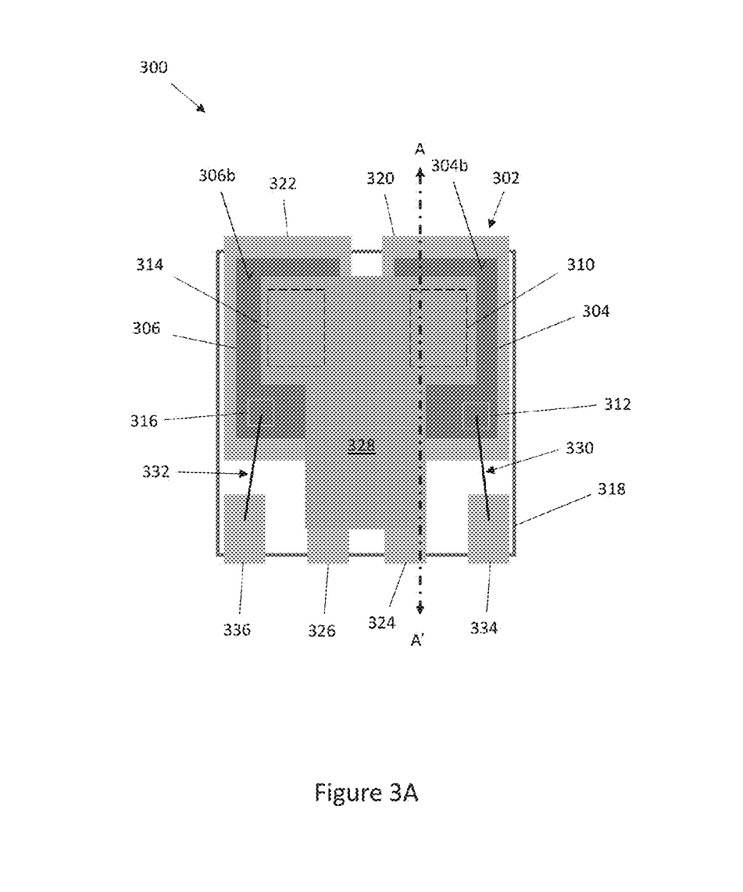
FIG. 3A illustrates a top down plan view of a first embodiment of a molded semiconductor package.
Figure 3B:
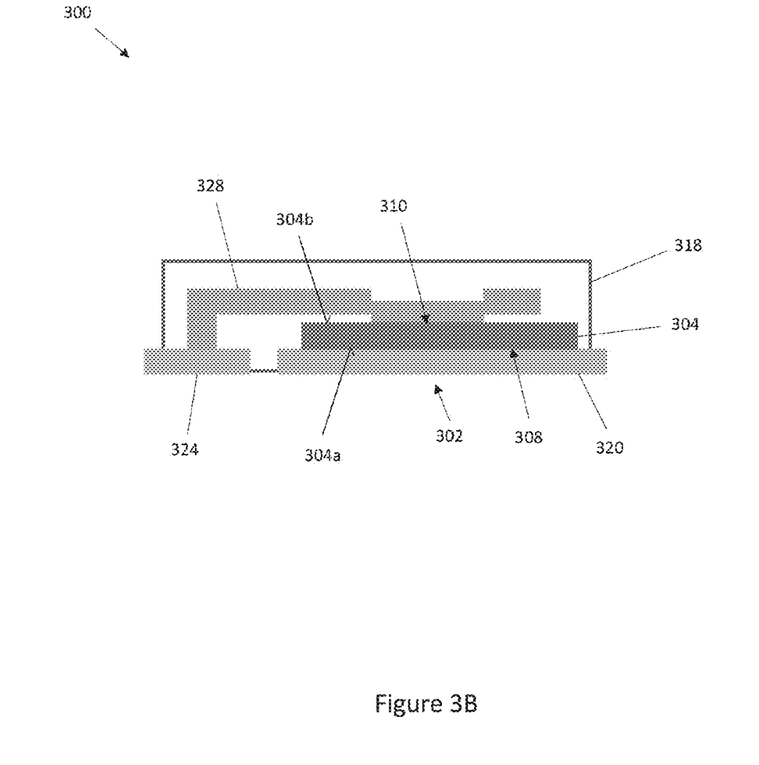
FIG. 3B illustrates a sectional view of the package along the line labeled A-A' in FIG. 3A.

FIG. 3A illustrates a top down plan view of an embodiment of a molded semiconductor package 300, and FIG. 3B illustrates a sectional view of the package 300 along the line labeled A-A' in FIG. 3A. According to this embodiment, the molded semiconductor package 300 includes a substrate 302, a first transistor die 304 secured to the substrate 302 and a second transistor die 306 also secured to the substrate 302. The first transistor die 304 has a source terminal 308 at the bottom side 304a of the first transistor die 304 which faces the substrate 302, and a drain terminal 310 and a gate terminal 312 at the top side 304b of the first transistor die 304 which faces away from the substrate 302. The second transistor die 306 has a drain terminal (out of view) at the bottom side (out of view) of the second transistor die 306 which faces the substrate 302, and a source terminal 314 and a gate terminal 316 at the top side 306b of the second transistor die 306 which faces away from the substrate 302.

The first transistor die 304 can be the low-side switch and the second transistor die 306 can be the high-side switch of a half bridge circuit, or the low-side and high-side switches of one leg of a H bridge or multi-phase converter circuit e.g. of the kind shown in FIGS. 2 and 1, respectively. In each case, the drain terminal of the first transistor die 304 and the source terminal 314 of the second transistor die 306 are illustrated as dashed boxes in FIG. 3A because they are out of view. The package 300 further includes a common electrical connection between the drain terminal 310 of the first transistor die 304 and the source terminal 314 of the second transistor die 306 which forms a common switch/phase node of the transistor die pair 304/306 e.g. as schematically illustrated in FIGS. 1 and 2.

The first and second transistor dies 304, 306 are embedded in a mold compound 318. The mold compound 318 is an electrically insulating material, and can be a thermosetting epoxy resin or a thermoplastic, for example. Only the exterior outline of the mold compound 318 is shown in FIGS. 3A and 3B so that the internal configuration of the package 300 is visible in both views. In one embodiment, the package substrate 302 comprises a lead frame which includes a die pad 320, 322 for each transistor die 304, 306 included in the package 300. The source terminal 308 at the bottom side 304a of the first transistor die 304 is connected e.g. soldered to a first die pad 320, and the drain terminal (out of view) at the bottom side (out of view) of the second transistor die 306 is similarly connected e.g. soldered to a second die pad 322.

The semiconductor package 300 is a leadless semiconductor package according to the illustrated embodiment, meaning that the package 300 employs a surface-mount technology. For example, one or more of I/O (input/output) pads 324, 326 of the lead frame form an output terminal of the semiconductor package 300. The common electrical connection between the pair of transistor dies 304/306 is realized by a metal clip 328 according to this embodiment. The metal clip 328 connects the drain terminal 310 of the first transistor die 304 and the source terminal 314 of the second transistor die 306 to the one or more pads 324, 326 which form the output terminal of the semiconductor package 300. The respective gate terminals 312, 316 of the transistor dies 304, 306 can be connected e.g. via respective bond wires 330, 332 to additional I/O pads 334, 334 of the lead frame which serve as respective input terminals of the package 300. Alternatively, the respective gate terminals 312, 316 can be connected to the corresponding I/O pads 334, 336 with metal clips instead of bond wires. The first die pad 320 can be connected to ground potential and the second die pad 322 can be connected to power e.g. $V_{Battery}$ as shown in FIGS. 1 and 2 to complete the electrical connections to the package 300.

Figure 4A:
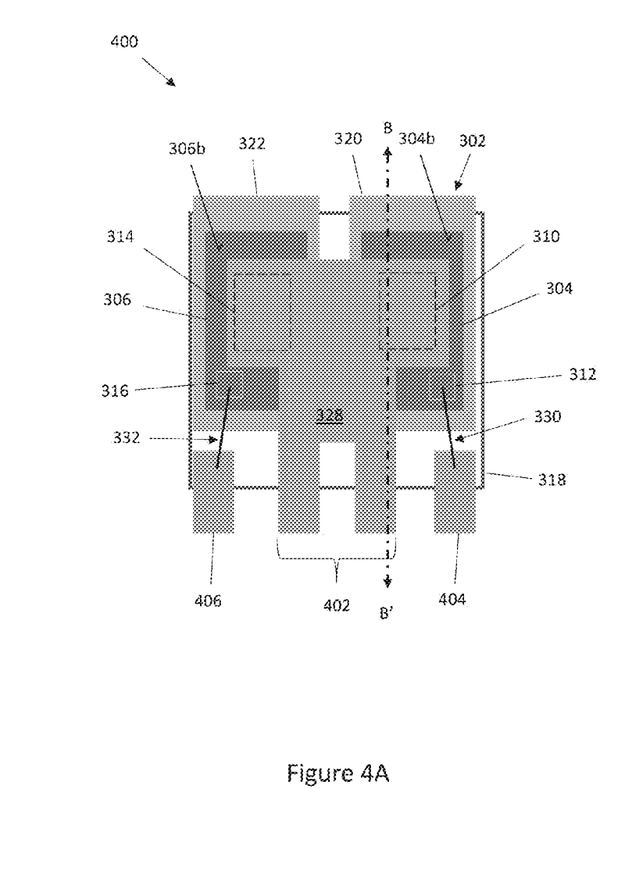
FIG. 4A illustrates a top down plan view of a second embodiment of a molded semiconductor package.
Figure 4B:
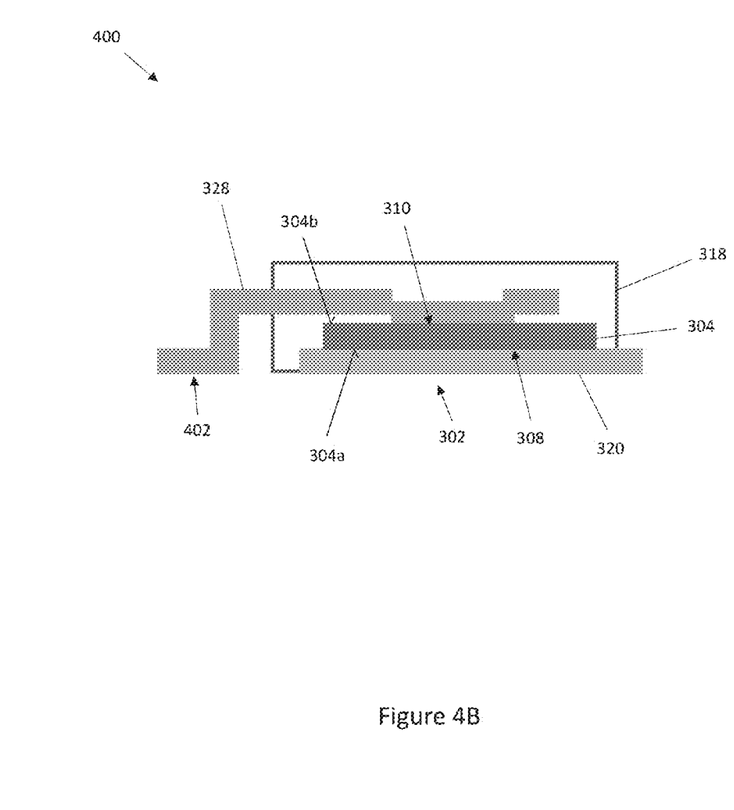
FIG. 4B illustrates a sectional view of the package along the line labeled B-B' in FIG. 4A.

FIG. 4A illustrates a top down plan view of another embodiment of a molded semiconductor package 400, and FIG. 4B illustrates a sectional view of the package 400 along the line labeled B-B' in FIG. 4A. The embodiment shown in FIGS. 4A and 4B is similar to the embodiment shown in FIGS. 3A and 3B. Different, however, the molded semiconductor package 400 is a leaded semiconductor package. Leaded packages have metal leads or pins which protrude from a mold compound and e.g. can wrap around the edge of the package whereas leadless packages have metal pads on the edges. According to this embodiment, the metal clip 328 connected to the drain terminal 310 of the first transistor die 304 and the source terminal 314 of the second transistor die 306 protrudes out of the mold compound 318 so as to form the output terminal 402 of the leaded semiconductor package 400. The leaded semiconductor package 400 includes additional leads/pins 404, 406 for the input (gate) terminals of the leaded package 400. As in FIGS. 3A and 3B, the die pads 320, 322 can still be used to provide ground potential and power, respectively, to the package 400.

Figure 5A:
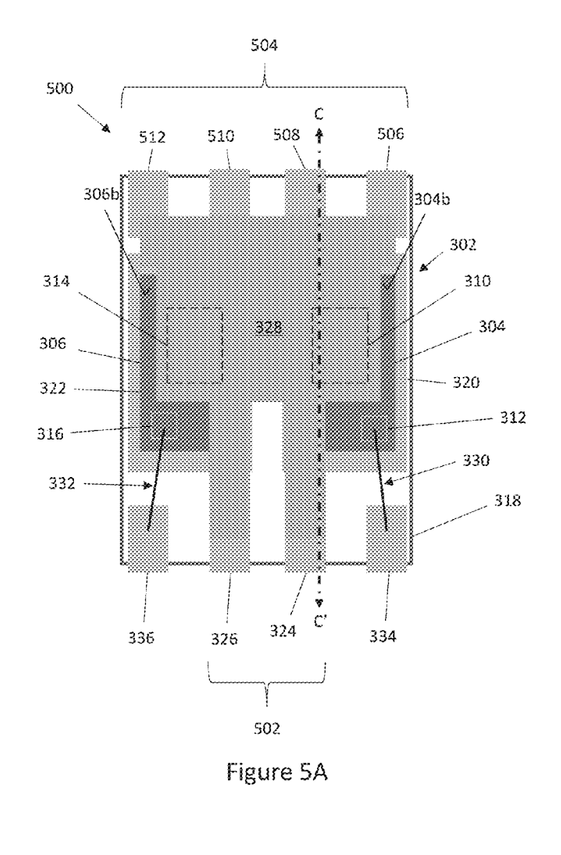
FIG. 5A illustrates a top down plan view of a third embodiment of a molded semiconductor package.
Figure 5B:
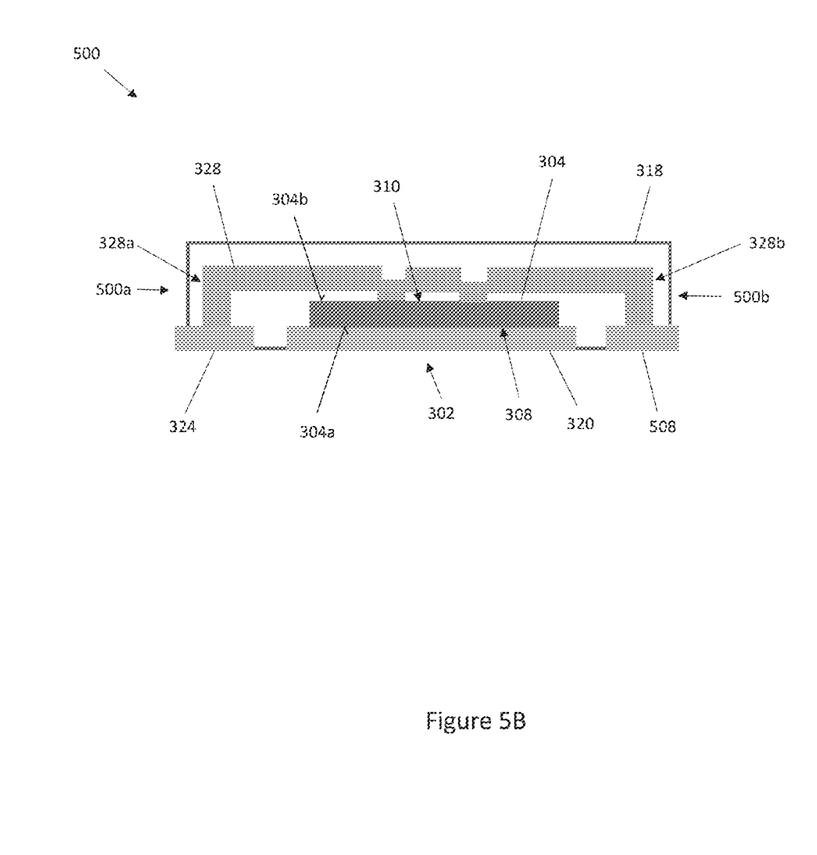
FIG. 5B illustrates a sectional view of the package along the line labeled C-C' in FIG. 5A.

FIG. 5A illustrates a top down plan view of yet another embodiment of a molded semiconductor package 500, and FIG. 5B illustrates a sectional view of the package 500 along the line labeled C-C' in FIG. 5A. The embodiment shown in FIGS. 5A and 5B is similar to the embodiment shown in FIGS. 3A and 3B. Different, however, a first group 502 of the lead frame pads 324, 326 which form the package output terminal are disposed at a first side 500a of the leadless semiconductor package 500 and a second group 504 of output terminal pads 506, 508, 510, 512 are disposed at a second side 500b of the leadless semiconductor package 500 opposite the first side 500a. Also, the metal clip 328 which provides the common electrical connection for the pair of transistor dies 304, 306 is connected at a first end 328a to the first group 502 of the output terminal pads 324, 326 and connected at a second end 328b opposite the first end 328a to the second group 504 of output terminal pads 506, 508, 510, 512.

Figure 6A:
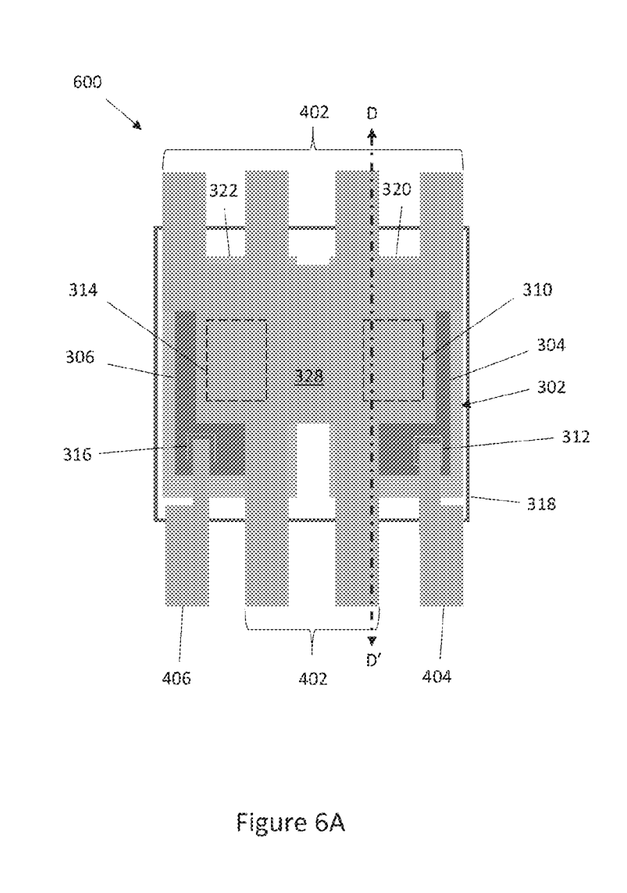
FIG. 6A illustrates a top down plan view of a fourth embodiment of a molded semiconductor package.
Figure 6B:
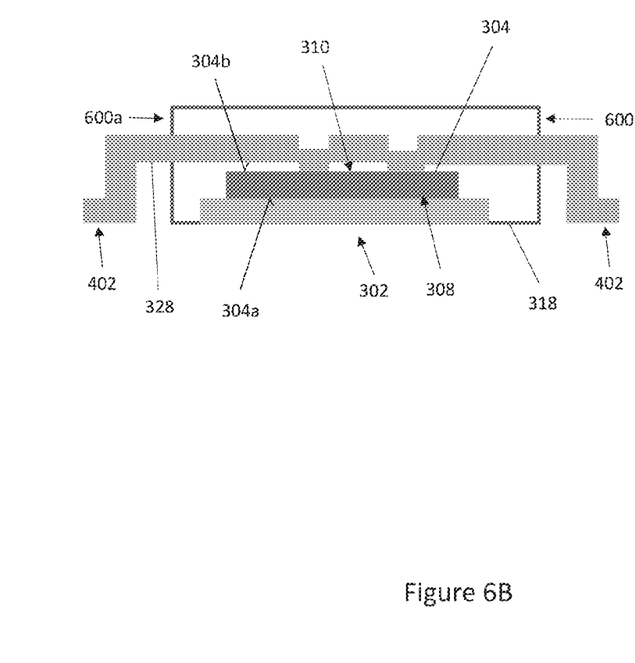
FIG. 6B illustrates a sectional view of the package along the line labeled D-D' in FIG. 6A.

FIG. 6A illustrates a top down plan view of still another embodiment of a molded semiconductor package 600, and FIG. 6B illustrates a sectional view of the package 600 along the line labeled D-D' in FIG. 6A. The embodiment shown in FIGS. 6A and 6B is similar to the embodiment shown in FIGS. 4A and 4B. Different, however, the metal clip 318 which provides the common electrical connection for the pair of transistor dies 304, 306 protrudes out of the mold compound 318 at a first side 600a of the leaded semiconductor package 600 and also protrudes out of the mold compound 318 at a second side 600b of the leaded semiconductor package 600 opposite the first side 600a so as to provide the output terminal 402 of the leaded semiconductor package 600 at opposing sides 600a, 600b of the package 600.

Figure 7A:
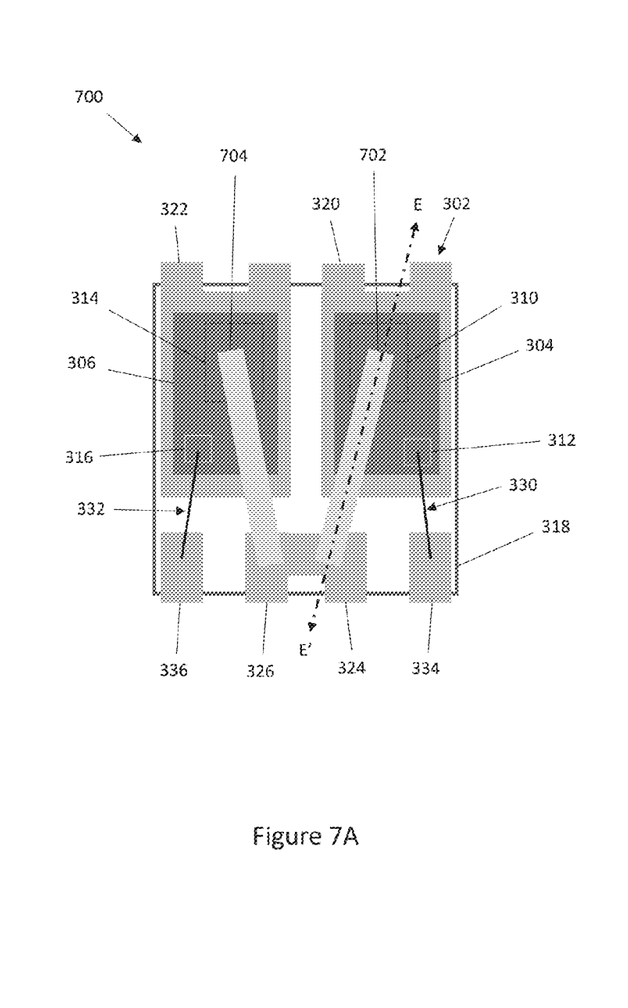
FIG. 7A illustrates a top down plan view of a fifth embodiment of a molded semiconductor package.
Figure 7B:
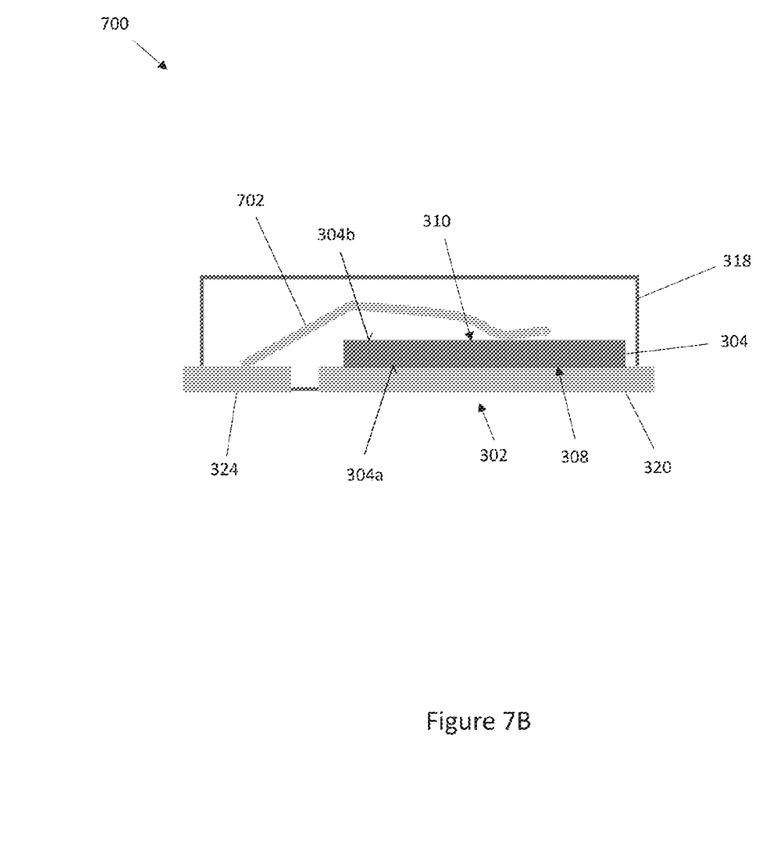
FIG. 7B illustrates a sectional view of the package along the line labeled E-E' in FIG. 7A.

FIG. 7A illustrates a top down plan view of another embodiment of a molded semiconductor package 700, and FIG. 7B illustrates a sectional view of the package 700 along the line labeled E-E' in FIG. 7A. The embodiment shown in FIGS. 7A and 7B is similar to the embodiment shown in FIGS. 3A and 3B. Different, however, the common electrical connection between the pair of transistor dies 304, 306 is realized by a first bond wire or metal ribbon 702 and a second bond wire or metal ribbon 704 instead of a metal clip. The first bond wire/metal ribbon 702 connects the drain terminal 310 of the first transistor die 304 to the corresponding output terminal pad 324 of the semiconductor package 700. The second bond wire/metal ribbon 704 connects the source terminal 314 of the second transistor die 306 to the same output terminal pad 324 as the first bond wire metal ribbon 702 or to a different output terminal pad 326 of the package 700.

Figure 8A:
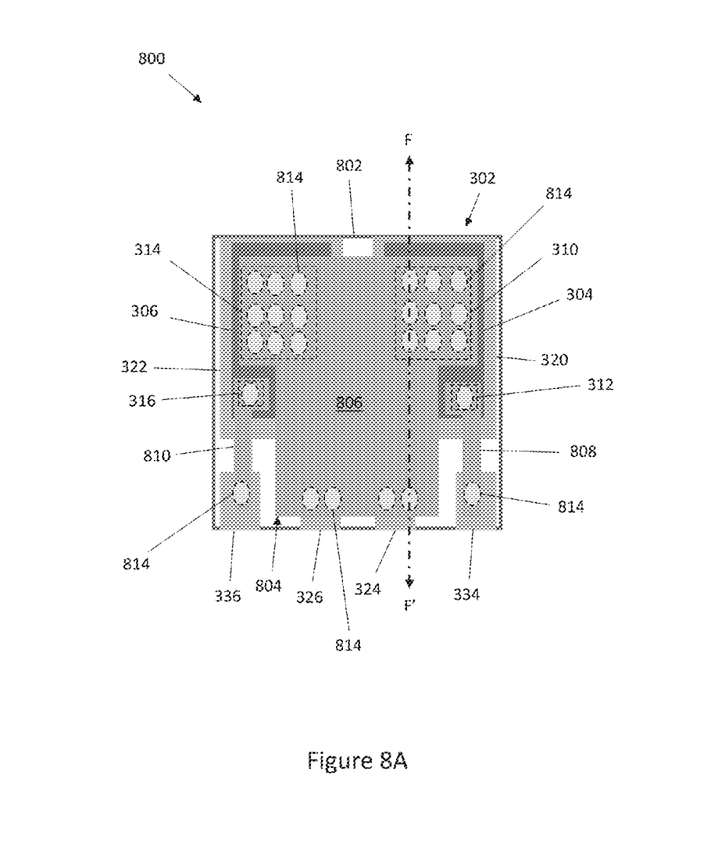
FIG. 8A illustrates a top down plan view of a first embodiment of a laminate-based semiconductor package.
Figure 8B:
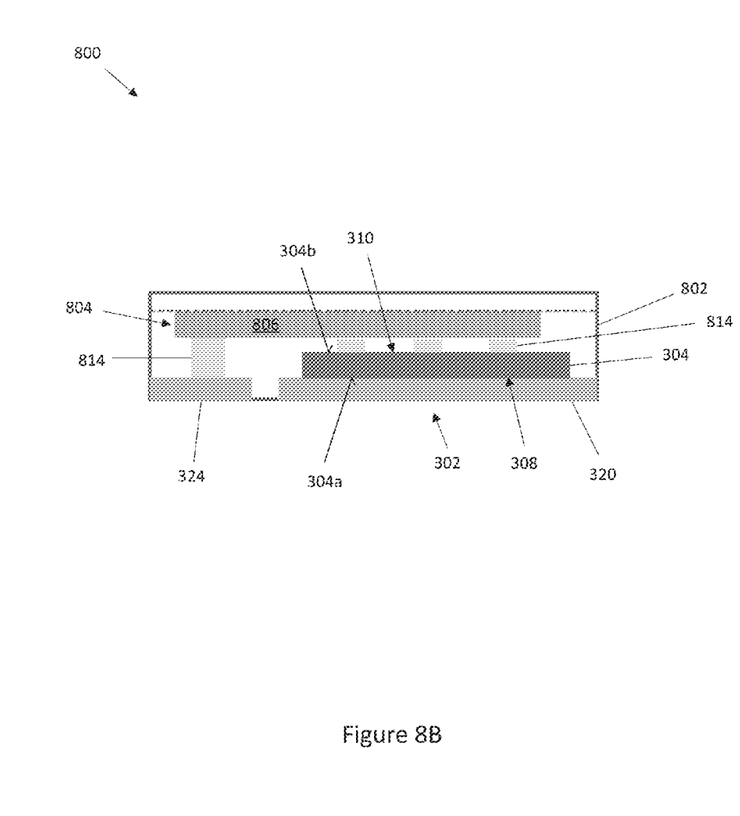
FIG. 8B illustrates a sectional view of the package along the line labeled F-F' in FIG. 8A.

FIG. 8A illustrates a top down plan view of another embodiment of a semiconductor package 800 which includes a source-down configured transistor die 304 and a drain-down configured transistor die 306 electrically connected at a common switch/phase node, and FIG. 8B illustrates a sectional view of the package 800 along the line labeled F-F' in FIG. 8A. The embodiment shown in FIGS. 8A and 8B is similar to the embodiment shown in FIGS. 3A and 3B. Different, however, the first and second transistor dies 304, 306 are embedded in an insulating material 802 and a structured metal redistribution layer (RDL) 804 is disposed in the insulating material 802 above the transistor dies 304, 306 so that the transistor dies 304, 306 are interposed between the substrate 302 and the structured metal redistribution layer 804.

The insulating material 802 can be a laminate such as standard PCB material or standard FR4 (fiberglass reinforced epoxy laminate) material. In another embodiment, the insulating material 802 can be a mold compound. Any standard chip lamination or molding process can be used to form the insulating material 802. For example, in the case of a laminate, the process can include diffusion soldering of the first and second transistor dies 304, 306, lamination of RCC (resin-coated-copper) on the assembled dies to form a polymer dielectric matrix, laser drilling of vias in the insulating material 802, and via filling by electroplating of copper. In the case of molded package, a mold compound is preheated prior to loading into a molding chamber. After pre-heating, the mold compound is forced by a hydraulic plunger into a pot where it reaches melting temperature and becomes fluid. The plunger then continues to force the fluid mold compound into runners of a mold chase. These runners serve as canals where the fluid mold compound travels until it reaches the cavities, which contain the objects for encapsulation.

The structured metal redistribution layer 804 is defined by the addition of metal and dielectric layers onto the surface of a wafer or carrier to re-route the I/O (input/output) layout of the transistor dies into a new, looser pitch footprint. Such redistribution utilizes thin film polymers such as BCB, (benzocyclobutene), polyimide, Asahi Glass ALX, etc. and metallization such Al or Cu to reroute the die I/O to an area array configuration. The redistribution trace can be fabricated directly on a primary passivation such as SiN or SiON, or can be routed over a second layer of polymer to add additional compliancy. One or more additional metal (and corresponding dielectric layers) can be connected to the structured metal redistribution layer 804 to facilitate connection to a board or other component. Such material layers are not shown in FIGS. 8A and 8B for ease of illustration.

The common electrical connection between the pair of transistor dies 304, 306 is implemented one section 806 of the structured metal redistribution layer 804 according to this embodiment. Input connections to the respective gate terminals 312, 316 of the transistor dies 304, 306 can be realized by other sections 808, 810 of the structured metal redistribution layer 804. Conductive vias 812 connect the separate sections 806, 808, 810 of the structured metal redistribution layer 804 to the corresponding die pads 320, 322 and lead frame pads 324, 326, 334, 336 which form the respective (input, output, power, ground) terminals of the semiconductor package 800. The conductive vias 814 can be formed as part of any standard RDL process, and are illustrated as dashed ovals in FIG. 8A because they are covered by the structured metal redistribution layer 804 and therefore out of view. The insulating material 802 can be thinned so as to expose the top side 806a of the structured metal redistribution layer 806 as indicated by the horizontal dashed line shown in FIG. 8B. Only the exterior outline of the insulating material 802 is shown in FIGS. 8A and 8B so that the internal configuration of the package 700 is visible in both views. Also, the top-side terminals 310, 314 of the first and second transistor dies 304, 306 are illustrated as dashed boxes because they are covered by the structured metal redistribution layer 804 and therefore out of view.

Figure 9A:
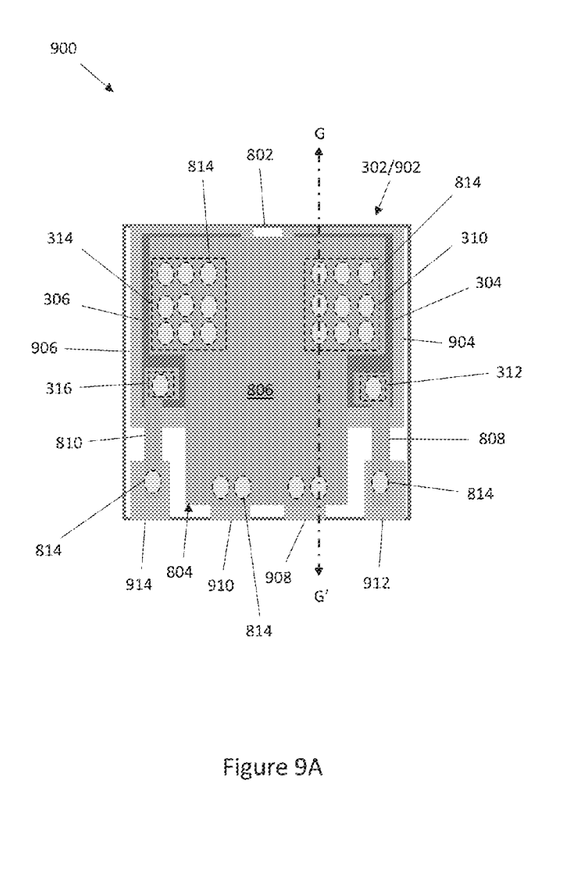
FIG. 9A illustrates a top down plan view of a second embodiment of a laminate-based semiconductor package.
Figure 9B:
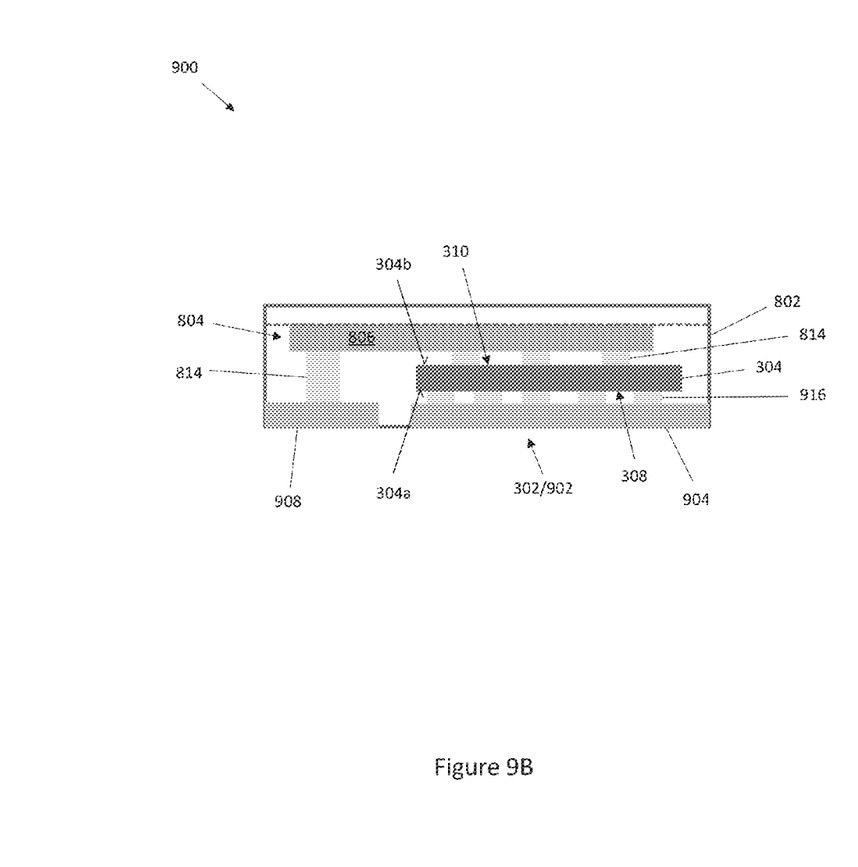
FIG. 9B illustrates a sectional view of the package along the line labeled G-G' in FIG. 9A.

FIG. 9A illustrates a top down plan view of another embodiment of a semiconductor package 900 which includes a source-down configured transistor die 304 and a drain-down configured transistor die 306 electrically connected at a common switch/phase node, and FIG. 9B illustrates a sectional view of the package 900 along the line labeled G-G' in FIG. 9A. The embodiment shown in FIGS. 9A and 9B is similar to the embodiment shown in FIGS. 8A and 8B. Different, however, a patterned metal layer 902 is used as the substrate 302 instead of a lead frame. The transistors 304, 306 are secured to different sections 904, 906 of the patterned metal layer 902. The I/O terminals (e.g. input, output, power, ground) of the package 900 are provided by additional sections 908, 910, 912, 914 of the patterned metal layer 902.

In one embodiment, the patterned metal layer 902 is a second structured metal redistribution layer disposed in the insulating material 802 below the transistor dies 304, 306 so that the transistor dies 304, 306 are interposed between the first (upper) structured metal redistribution layer 804 and the second (lower) structured metal redistribution layer 902. Similar to the embodiment shown in FIGS. 8A and 8B, additional conductive vies 916 connect the bottom terminal of the transistor dies 304, 306 (i.e. the source terminal of the source-down configured transistor die and the drain terminal of the drain-down configured transistor die) to the corresponding sections 904, 906 of the lower structured metal redistribution layer 902 which form the respective power and ground terminals of the semiconductor package 900.

Figure 10:
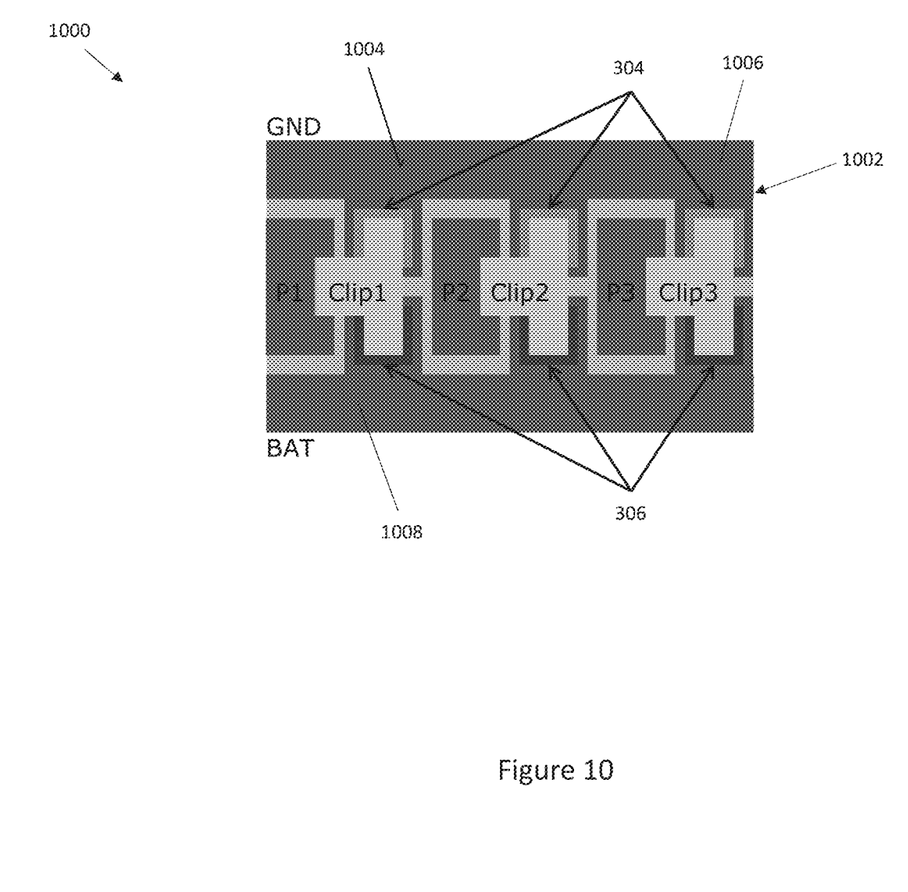
FIG. 10 illustrates a top down plan view of an embodiment of a semiconductor package having a ceramic base.

FIG. 10 illustrates a top down plan view of yet another embodiment of a semiconductor package 1000 which includes at least two pairs of source-down configured transistor dies 304 and drain-down configured transistor dies 306 electrically connected at a common switch/phase node. Three pairs of transistor dies 304, 206 are shown secured to the package substrate 1002 in FIG. 10. However, the package 100 can include two, three, four or more pairs of oppositely configured transistor dies 304, 306. Each pair of transistor dies 304, 206 provides one phase of a multi-phase converter circuit and includes a source-down configured transistor die 304 having a source terminal (out of view) facing the substrate 1002 and a drain terminal (out of view) and a gate terminal (not shown) facing away from the substrate 1002, and a drain-down configured transistor die 306 having a drain terminal (out of view) facing the substrate 1002 and a source terminal (out of view) and a gate terminal (not shown) facing away from the substrate 1002. The exemplary embodiment shown in FIG. 10 includes three such pairs of transistor dies 304, 306 secured to the package substrate 1002. For each pair of transistor dies 304, 306 included in the package 1000, the drain terminal of the source-down configured transistor die 304 is electrically connected to the source terminal of the drain-down configured transistor die 306 e.g. via a corresponding metal clip (Clip1, Clip2, Clip3, etc.).

In one embodiment, the package substrate 1002 comprises a ceramic base (out of view) having a patterned metallized surface 1004. The source terminal at the bottom side of each source-down configured transistor die 304 is connected to a first section 1006 of the patterned metallized surface 1004 which forms the ground terminal of the package 100. The drain terminal at the bottom side of each drain-down configured transistor die 306 is connected to a second section 1008 of the patterned metallized surface 1004 which forms the power terminal of the package 1000. The output terminal of the semiconductor package comprises third sections (P1, P2, P3, etc.) of the patterned metallized surface 1004, each third section forming one phase of the multi-phase converter circuit. Each metal clip which connects the drain terminal of one source-down configured transistor die 304 to the source terminal of the corresponding drain-down configured transistor die 306 is connected at a different end to one of the third sections of the patterned metallized surface 1004 to realize the phase connections of the circuit. The sections of the metallized surface 1004 are electrically separated from one another. The top side terminal connections to the respective transistor dies are not shown in FIG. 10 for ease of illustration, but can be readily realized using e.g. bond wire, ribbon or clip connections to additional separate sections of the metallized surface 1004 of the ceramic base which are not shown in FIG. 10 for ease of illustration.

Of course, other circuit configurations such as H bridge and half bridge can be realized on a ceramic base having a patterned metallized surface by securing the appropriate number of transistor die pair(s) to the patterned metallized surface of the ceramic base, each transistor die including a source-down configured transistor die having its source terminal connected to one section of the metallized surface and its drain and gate terminals facing away from the ceramic base, and a drain-down configured transistor die having its drain terminal connected to a different section of the metallized surface and its source and gate terminals facing away from the ceramic base.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:
1. A semiconductor package, comprising:
a substrate;
a first transistor die secured to the substrate, the first transistor die having a source terminal at a bottom side of the first transistor die which faces the substrate and a drain terminal and a gate terminal at a top side of the first transistor die which faces away from the substrate;
a second transistor die secured to the substrate, the second transistor die having a drain terminal at a bottom side of the second transistor die which faces the substrate and a source terminal and a gate terminal at a top side of the second transistor die which faces away from the substrate; and
a common electrical connection between the drain terminal of the first transistor die and the source terminal of the second transistor die,
wherein the first transistor die is a multi-gate MOSFET die and the second transistor die is a single-gate MOSFET die,
wherein the multi-gate MOSFET die comprises a plurality of gate surfaces acting electrically as a single gate for a device included in the multi-gate MOSFET die,
wherein the single-gate MOSFET die comprises a single gate surface acting electrically as a single gate for a device included in the single-gate MOSFET die.

2. The semiconductor package of claim 1, wherein the substrate comprises a lead frame which includes a first die pad, a second die pad and a plurality of pads, wherein the source terminal at the bottom side of the first transistor die is connected to the first die pad, and wherein the drain terminal at the bottom side of the second transistor die is connected to the second die pad.

3. The semiconductor package of claim 2, wherein the semiconductor package is a leadless semiconductor package, wherein one or more of the pads form an output terminal of the semiconductor package, and wherein the common electrical connection comprises one or more electrical conductors which connect the drain terminal of the first transistor die and the source terminal of the second transistor die to the one or more pads which form the output terminal of the semiconductor package.

4. The semiconductor package of claim 3, wherein a first group of the pads are disposed at a first side of the semiconductor package, wherein a second group of the pads are disposed at a second side of the semiconductor package opposite the first side, wherein the first and the second group of pads form an output terminal of the semiconductor package; and wherein the one or more electrical conductors which comprise the common electrical connection are connected at a first end to the first group of the one or more pads and connected at a second end opposite the first end to the second group of the one or more pads.

5. The semiconductor package of claim 2, wherein the semiconductor package is a leaded semiconductor package, wherein the first and second transistor dies are embedded in a mold compound, wherein the common electrical connection comprises a metal clip which is connected to the drain terminal of the first transistor die and the source terminal of the second transistor die, wherein the metal clip protrudes out of the mold compound so as to form an output terminal of the semiconductor package.

6. The semiconductor package of claim 5, wherein the metal clip protrudes out of the mold compound at a first side of the semiconductor package and protrudes out of the mold compound at a second side of the semiconductor package opposite the first side so as to provide the output terminal of the semiconductor package at opposing sides of the semiconductor package.

7. The semiconductor package of claim 1, wherein the substrate comprises a ceramic base having a patterned metallized surface, wherein the source terminal at the bottom side of the first transistor die is connected to a first section of the patterned metallized surface, wherein the drain terminal at the bottom side of the second transistor die is connected to a second section of the patterned metallized surface, wherein an output terminal of the semiconductor package comprises a third section of the patterned metallized surface, wherein the common electrical connection comprises one or more electrical conductors which connect the drain terminal of the first transistor die and the source terminal of the second transistor die to the third section of the patterned metallized surface, and wherein the first, second and third sections of the metallized surface are electrically separated from one another.

8. The semiconductor package of claim 1, wherein the common electrical connection comprises a metal clip connected to the drain terminal of the first transistor die and the source terminal of the second transistor die.

9. The semiconductor package of claim 1, wherein the common electrical connection comprises a first bond wire or metal ribbon connecting the drain terminal of the first transistor die to an output terminal of the semiconductor package and a second bond wire or metal ribbon connecting the source terminal of the second transistor die to the output terminal of the semiconductor package.

10. The semiconductor package of claim 1, further comprising:
   an insulating material in which the first and second transistor dies are embedded; and
   a structured metal redistribution layer disposed in the insulating material above the first and second transistor dies so that the first and second transistor dies are interposed between the substrate and the structured metal redistribution layer,
   wherein the common electrical connection comprises part of the structured metal redistribution layer.

11. The semiconductor package of claim 1, wherein the first and second transistor dies are embedded in a mold compound.

12. The semiconductor package of claim 1, wherein the multi-gate MOSFET die is a power FinFET die.

13. The semiconductor package of claim 12, wherein the power FinFET die is rotated by 90° whereby a major surface of the power FinFET die is substantially perpendicular to a major surface of the substrate.

14. The semiconductor package of claim 1, wherein the source terminal of the first transistor die is electrically connected to a ground terminal of the semiconductor package, wherein the drain terminal of the second transistor die is electrically connected to a power terminal of the semiconductor package, and wherein the first and second transistor dies provide one phase of a multi-phase converter circuit.

15. The semiconductor package of claim 1, wherein the source terminal of the first transistor die is electrically connected to a ground terminal of the semiconductor package, wherein the drain terminal of the second transistor die is electrically connected to a power terminal of the semiconductor package, and wherein the first and second transistor dies provide one leg of an H bridge circuit.

16. A semiconductor package, comprising:
   a substrate; and
   at least two pairs of transistor dies secured to the substrate, each pair of transistor dies providing one phase of a multi-phase converter circuit and including a source-down configured transistor die having a source terminal facing the substrate and a drain terminal and a gate terminal facing away from the substrate, and a drain-down configured transistor die having a drain terminal facing the substrate and a source terminal and a gate terminal facing away from the substrate,
   wherein for each pair of transistor dies:
      the drain terminal of the source-down configured transistor die is electrically connected to the source terminal of the drain-down configured transistor die,
      the source-down configured transistor die is a multi-gate MOSFET die and the drain-down configured transistor die is a single-gate MOSFET die,
      wherein the multi-gate MOSFET die comprises a plurality of gate surfaces acting electrically as a single gate for a device included in the multi-gate MOSFET die,
      wherein the single-gate MOSFET die comprises a single gate surface acting electrically as a single gate for a device included in the single-gate MOSFET die.

* * * * *